US012715172B2

(12) United States Patent
Song et al.

(10) Patent No.: US 12,715,172 B2
(45) Date of Patent: Aug. 25, 2026

(54) DIGITAL LIGHT PROCESSING 3D PRINTED MONOLITHIC SUBSTRATES WITH INTEGRATED AND EMBEDDED SENSORS

(71) Applicant: Toyota Motor Engineering & Manufacturing North America, Inc., Plano, TX (US)

(72) Inventors: Yuyang Song, Ann Arbor, MI (US); Masato Tanaka, Ann Arbor, MI (US); Liang Yue, Atlanta, GA (US); Hang Qi, Marietta, GA (US)

(73) Assignees: Toyota Motor Engineering & Manufacturing North America, Inc., Plano, TX (US); Georgia Tech Research Corporation, Atlanta, GA (US)

( * ) Notice: Subject to any disclaimer, the term of this patent is extended or adjusted under 35 U.S.C. 154(b) by 820 days.

(21) Appl. No.: 17/977,314

(22) Filed: Oct. 31, 2022

(65) Prior Publication Data

US 2024/0140022 A1 May 2, 2024

(51) Int. Cl.

| | |
|---|---|
| ***B29C 64/129*** | (2017.01) |
| ***B33Y 80/00*** | (2015.01) |
| ***B81B 7/04*** | (2006.01) |
| ***C08F 265/06*** | (2006.01) |

(52) U.S. Cl.
CPC ............ *B29C 64/129* (2017.08); *B33Y 80/00* (2014.12); *B81B 7/04* (2013.01); *C08F 265/06* (2013.01)

(58) Field of Classification Search
None
See application file for complete search history.

(56) References Cited

U.S. PATENT DOCUMENTS

| | | | | |
|---|---|---|---|---|
| 10,639,844 | B2 | 5/2020 | Rolland et al. | |
| 11,059,025 | B2 | 7/2021 | Lee et al. | |
| 2020/0299440 | A1* | 9/2020 | Wang .................. | C08K 5/1535 |

FOREIGN PATENT DOCUMENTS

| | | | | |
|---|---|---|---|---|
| WO | WO-2016145050 A1 * | 9/2016 | ......... | B81C 1/00071 |

OTHER PUBLICATIONS

Li et al., "Bioinspired design and additive manufacturing of soft materials, machines, robots, and haptic interfaces," Angew. Chem. Int. Ed., 58, Feb. 2019, pp. 11182-11204.

(Continued)

*Primary Examiner* — Yan Lan
(74) *Attorney, Agent, or Firm* — Christopher G. Darrow; Darrow Mustafa PC

(57) ABSTRACT

A sensor includes a grayscale digital light processing (g-DLP) 3D printed monolithic substrate with at least one microfluid channel. The monolithic substrate is formed from a resin configured to form a solid polymer using g-DLP 3D printing with a Young's modulus ranging from 0.1 MPa to 100 MPa. The resin includes a donor moiety, an acceptor moiety different than the donor moiety, a rigid moiety, a photoinitiator, and a photoabsorber. The donor moiety is in the form of an acrylate monomer with a side group, the acceptor moiety is in the form of an acrylate monomer with a side group, and the rigid moiety is in the form of an acrylate monomer with a side group. Also, the sensor can include a sensor fluid disposed within the at least one microfluid channel.

12 Claims, 10 Drawing Sheets

(56) References Cited

OTHER PUBLICATIONS

Arias-Ferreiro et al., "Photocured conductive PANI/acrylate composites for digital light processing. Influence of HDODA crosslinker in rheological and physicochemical properties" European Polymer Journal vol. 136, Aug. 5, 2020, pp. 1-11.

Mu et al., "Digital light processing 3D printing of conductive complex structures," Additive Manufacturing 18, Aug. 22, 2017, pp. 74-83.

* cited by examiner

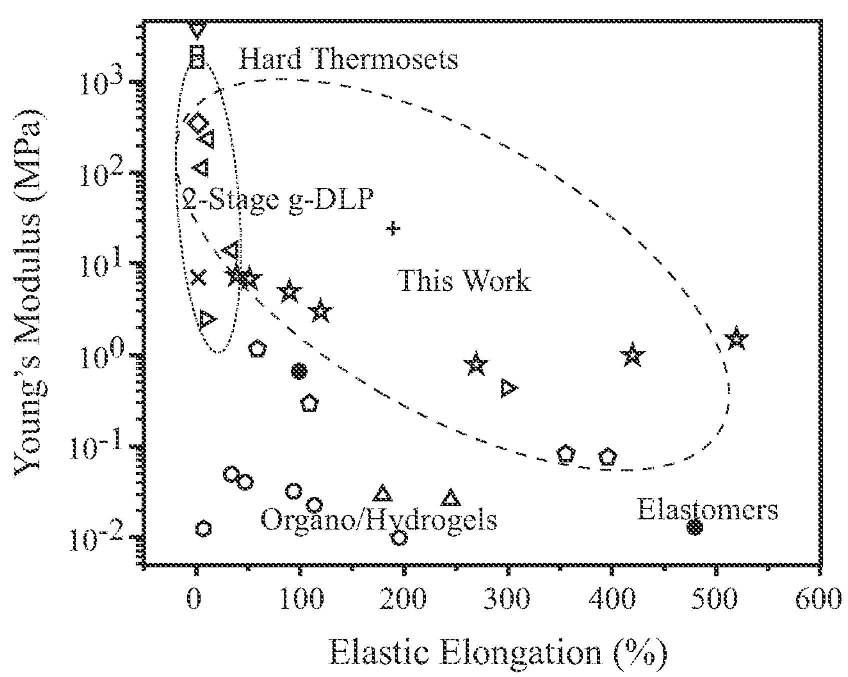
FIG. 4B
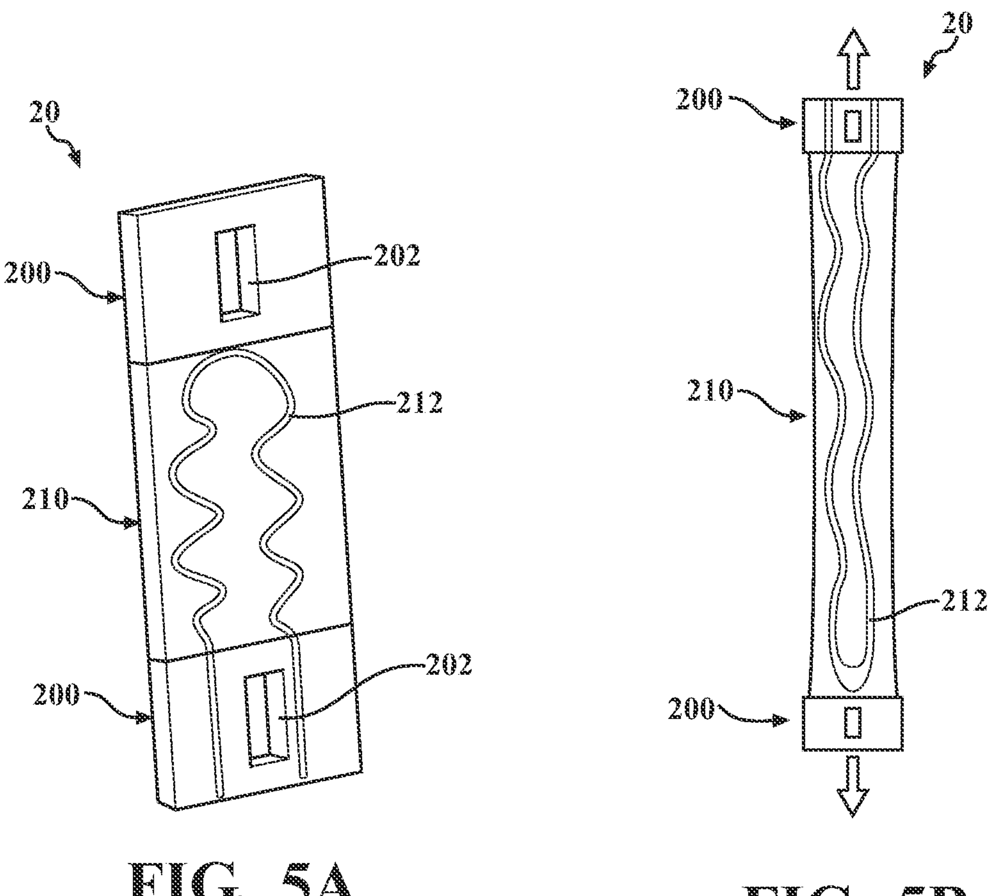
FIG. 5A
FIG. 5B

P
E1
E2
312
310
300
30
305

DIGITAL LIGHT PROCESSING 3D PRINTED MONOLITHIC SUBSTRATES WITH INTEGRATED AND EMBEDDED SENSORS

TECHNICAL FIELD

The present disclosure generally relates to sensors, and particularly to sensors formed by digital light processing 3D printing.

BACKGROUND

Sensors produce or generate an output signal for the purpose of sensing a physical phenomenon. For example, sensors are used to measure or detect physical phenomenon such as strain, temperature, pressure, and distance, among others.

Traditional sensors are typically attached to a substrate using adhesives, tapes and/or mechanical fasteners, which impose design and/or manufacturing constraints on ends users such as Original Equipment Manufacturers (OEMs).

The present disclosure addresses these issues with sensor design and manufacture, and other issues related to sensors.

SUMMARY

In one form of the present disclosure, a sensor includes a grayscale digital light processing (g-DLP) 3D printed monolithic substrate with at least one microfluid channel configured for a fluid to be disposed therein. The monolithic substrate is formed from a resin configured to form a solid polymer using g-DLP 3D printing with a Young's modulus ranging from 0.1 MPa to 100 MPa.

In another form of the present disclosure, a sensor includes a g-DLP 3D printed monolithic substrate with at least one microfluid channel. The monolithic substrate is formed from a resin configured to form a solid polymer using g-DLP 3D printing with a Young's modulus ranging from 0.1 MPa to 100 MPa. The resin includes a donor moiety, an acceptor moiety different than the donor moiety, a rigid moiety, a photoinitiator, and a photoabsorber. The donor moiety is in the form of an acrylate monomer with a side group comprising at least one of a free carbonyl, a primary amine on an acrylate, a secondary amine on an acrylate, and a tertiary amine on an acrylate. The acceptor moiety is in the form of an acrylate monomer with a side group comprising at least one of a free hydroxy, a primary amine, secondary amine, and an imine. And the rigid moiety is in the form of an acrylate monomer with a side group comprising one or more of a cyclohexyl, a substituted cyclohexyl, and a bicyclic structure. Also, the sensor includes a sensor fluid disposed within the at least one microfluid channel.

In still another form of the present disclosure, a sensor includes a g-DLP 3D printed substrate with at least one microfluid channel. The g-DLP 3D printed substrate is formed from a resin configured to form a solid polymer using g-DLP 3D printing with a Young's modulus ranging from 0.1 MPa to 100 MPa, and the resin includes a donor moiety comprising 2-hydroxyethyl acrylate, an acceptor moiety comprising aliphatic urethane-based diacrylate, and a rigid moiety comprising isobornyl acrylate. The resin also includes a photoinitiator and a photoabsorber, and a sensor fluid is disposed within the at least one microfluid channel.

These and other features of the composite salt mixture and its preparation will become apparent from the following detailed description when read in conjunction with the figures and examples, which are exemplary, not limiting.

BRIEF DESCRIPTION OF THE DRAWINGS

The present teachings will become more fully understood from the detailed description and the accompanying drawings, wherein:

FIG. 4B is a plot of Young's modulus versus percent elastic elongation for tensile samples manufactured via g-DLP 3D printing using a resin according to the teachings of the present disclosure and compared to traditional materials;

FIG. 5A shows an extension strain gauge with a wave-shaped microfluidic channel in a soft membrane positioned between a pair of stiff ends according to the teachings of the present disclosure;

FIG. 5B shows the extension strain gauge in FIG. 5B being subjected to strain;

Figure 1:
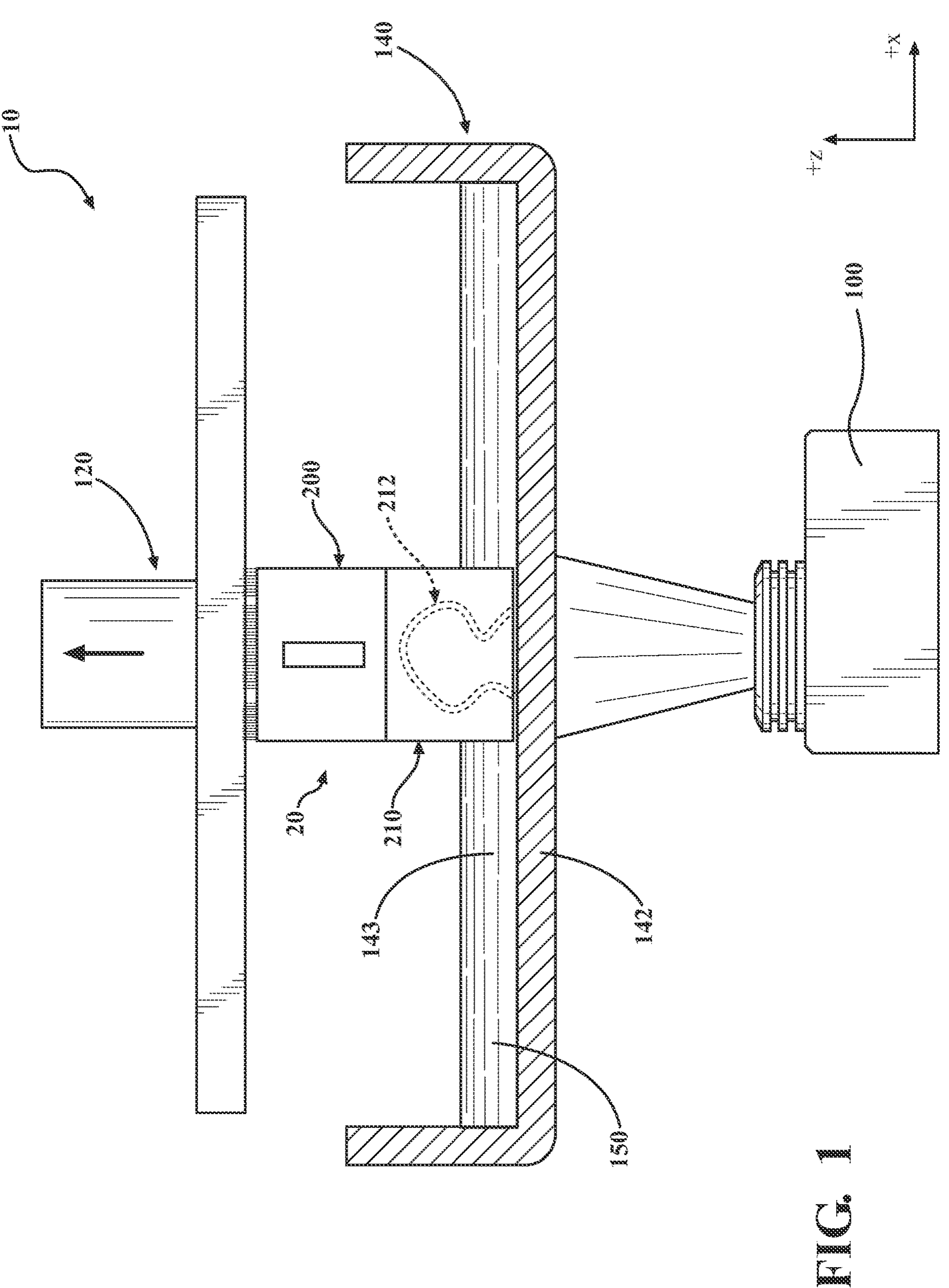
FIG. 1 illustrates a g-DLP 3D printer.

It should be noted that the figures set forth herein are intended to exemplify the general characteristics of the composite salt mixtures and electrolytes of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides substrates for sensors that are formed at least partially using single-vat single cure g-DLP 3D printing. The sensors are formed from a resin having a composition that provides highly stretchable soft organogel portions and stiff thermoset portions within a single layer of printing. As used herein, the term "stiff" refers to portions of a monolithic substrate that exhibit a Young's modulus equal to or greater than 10 MPa and the term "soft" refers to portions of a monolithic substrate that exhibit a Young's modulus equal to or less than 5 MPa, with non-limiting examples of stiff portions and soft portions discussed in greater detail below. In addition, the resins provide for the manufacture of a monolithic 3D printed component having one or more stretchable (elastic) soft organogel portions and one or more stiff thermoset portions, without the use or need of multiple vats of different resins.

In some variations, a monolithic structure manufactured with a g-DLP 3D printer using a resin according to the teachings of the present disclosure exhibits Young Moduli ranging from about 10 MPa to about 100 MPa. In at least one variation, a monolithic structure manufactured with a g-DLP 3D printer using a resin according to the teachings of the present disclosure exhibits Young Moduli ranging from about 10 MPa to about 200 MPa. In some variations a monolithic structure manufactured with a g-DLP 3D printer using a resin according to the teachings of the present disclosure exhibits Young Moduli ranging from about 10 MPa to about 300 MPa. And in at least one variation, a monolithic structure manufactured with a g-DLP 3D printer using a resin according to the teachings of the present disclosure exhibits Young Moduli ranging from about 10 MPa to about 400 MPa or from about 10 MPa to about 478 MPa.

In some variations, a monolithic structure manufactured with a g-DLP 3D printer using a resin according to the teachings of the present disclosure exhibits Young Moduli ranging from about 8 MPa to about 100 MPa. In at least one variation, a monolithic structure manufactured with a g-DLP 3D printer using a resin according to the teachings of the present disclosure exhibits Young Moduli ranging from about 5 MPa to about 100 MPa. In some variations a monolithic structure manufactured with a g-DLP 3D printer using a resin according to the teachings of the present disclosure exhibits Young Moduli ranging from about 2 MPa to about 100 MPa. And in at least one variation, a monolithic structure manufactured with a g-DLP 3D printer using a resin according to the teachings of the present disclosure exhibits Young Moduli ranging from about 1 MPa to about 100 MPa or from about 0.5 MPa to about 100 MPa or from about 0.1 MPa to about 100 MPa.

In some variations, a monolithic structure manufactured with a g-DLP 3D printer using a resin according to the teachings of the present disclosure exhibits Young Moduli ranging from about 5 MPa to about 200 MPa. In at least one variation, a monolithic structure manufactured with a g-DLP 3D printer using a resin according to the teachings of the present disclosure exhibits Young Moduli ranging from about 2 MPa to about 200 MPa. In some variations a monolithic structure manufactured with a g-DLP 3D printer using a resin according to the teachings of the present disclosure exhibits Young Moduli ranging from about 1 MPa to about 300 MPa. And in at least one variation, a monolithic structure manufactured with a g-DLP 3D printer using a resin according to the teachings of the present disclosure exhibits Young Moduli ranging from about 0.5 MPa to about 400 MPa or from about 0.1 MPa to about 475 MPa.

In some variations, a monolithic structure manufactured with a g-DLP 3D printer using a resin according to the teachings of the present disclosure exhibits an elastic elongation up to 100%. And in some variations, a monolithic structure manufactured with a g-DLP 3D printer using a resin according to the teachings of the present disclosure exhibits an elastic elongation up to 200%, up to 300%, up to 400%, up to 450%, or over 450%. Stated differently, a monolithic structure manufactured via g-DLP 3D printing using a resin according to the teachings of the present disclosure has at least one portion with low stiffness and high elasticity and at least one portion with high stiffness and high strength as described in greater detail below.

It should be understood that 3D printing allows for the fabrication of components and structures with geometric and material complexities beyond what is physically and/or economically possible with traditional manufacturing techniques such as casting, machining, cold working, hot working, among others. And new 3D printing capabilities have demonstrated use in functional applications or structures such as deployable structures, soft robotics, flexible electrical components, and biomimetic designs. However, many functional applications such as nature-like structures, airless tires, multi-stable absorbers, and 4D printing require the use of materials with vastly different properties. That is, such structures have or require different portions with very different mechanical and/or physical properties.

It should also be understood that DLP 3D printing is a high-speed and high-resolution printing method that has become increasingly popular in recent years. Digital light processing uses a projector to irradiate hundreds or thousands of thin layers of resin having predefined cross-sections of a solid part such that each thin layer is cured and the solid part is manufactured layer-by-layer. In a typical DLP printing process, a single resin vat is used, only z-direction motion of a build plate is needed to form a component, and photopolymerization (or photocuring) of the thin layers occurs in a few seconds. Accordingly, DLP 3D printing is one of the fastest 3D printing technologies. However, the use of a single resin vat makes DLP in general, not suitable for printing parts with multiple material properties. Methods using multiple vats have been developed to print two or more materials by transferring a printed part between multiple vats. However, cross-contamination between multiple vats, switching between different resin vats and cleaning significantly slows down the printing speed.

In g-DLP printing, the local degree of monomer conversion (curing) is controlled by light intensity, which is manipulated at pixel level by an input grayscale image. For example, and with reference to FIG. 1, a g-DLP 3D printer 10 with a projector 100, build platform 120, and a single resin vat 140 containing a resin 150 according to the teachings of the present disclosure is shown. The projector 100 is configured to project a grayscale image onto a transparent bottom wall 142 of the single resin vat 140 such that a layer of the resin 150 having a predefined cross-section of a sensor 20 is illuminated and cured. After the layer of the resin 150 is illuminated (and cured) via the grayscale exposure from the projector 100, the build platform 120 moves in the +z-direction shown in the figure and the resin 150 flows into or between the mostly cured layer of resin and an upper surface 143 of the transparent bottom wall 142. Then, the projector 100 projects another grayscale image onto the transparent bottom wall 142 of the single resin vat 140 such that the most recent layer of the resin 150 is illuminated with another predefined cross-section of the sensor 20. The process or cycle continues until manufacture of the sensor 20, layer-by-layer, is complete. In this manner, the g-DLP 3D printer 10 can fabricate a monolithic sensor 20 with a stiff end 200 and a soft membrane 210 using the single reason vat 140. And in some variations, the stiff end 200 can include an attachment aperture 202 (FIG. 5A) and the soft membrane 210 can include a microfluidic channel 212 (e.g., a wave-shaped microfluidic channel).

Figure 2A:
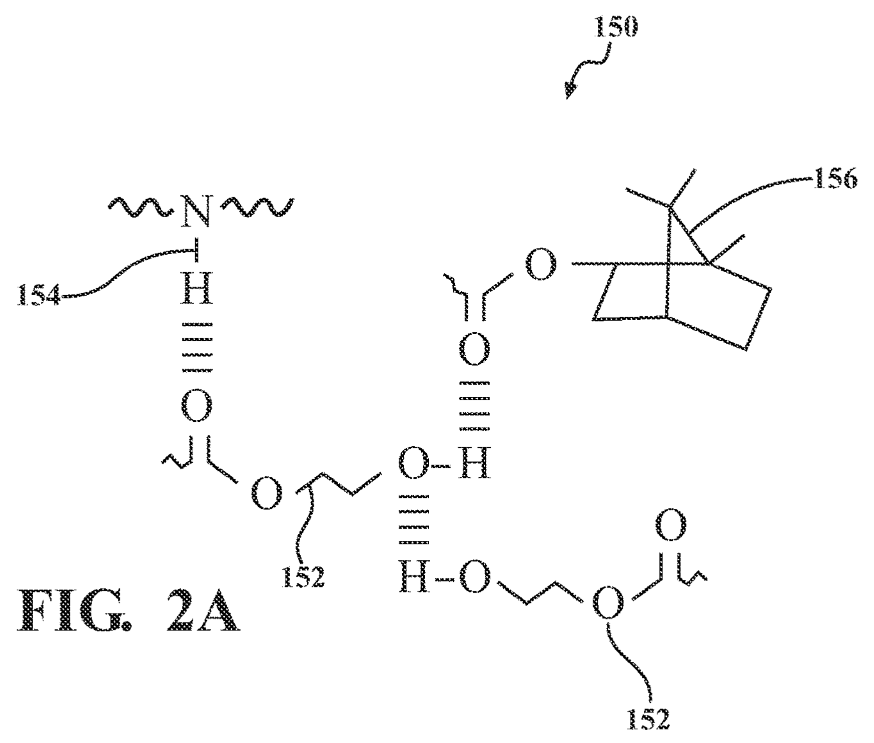
FIG. 2A illustrates a resin according to the teachings of the present disclosure with hydrogen bonding between a donor moiety, an acceptor moiety, and a rigid moiety.
Figure 2B:
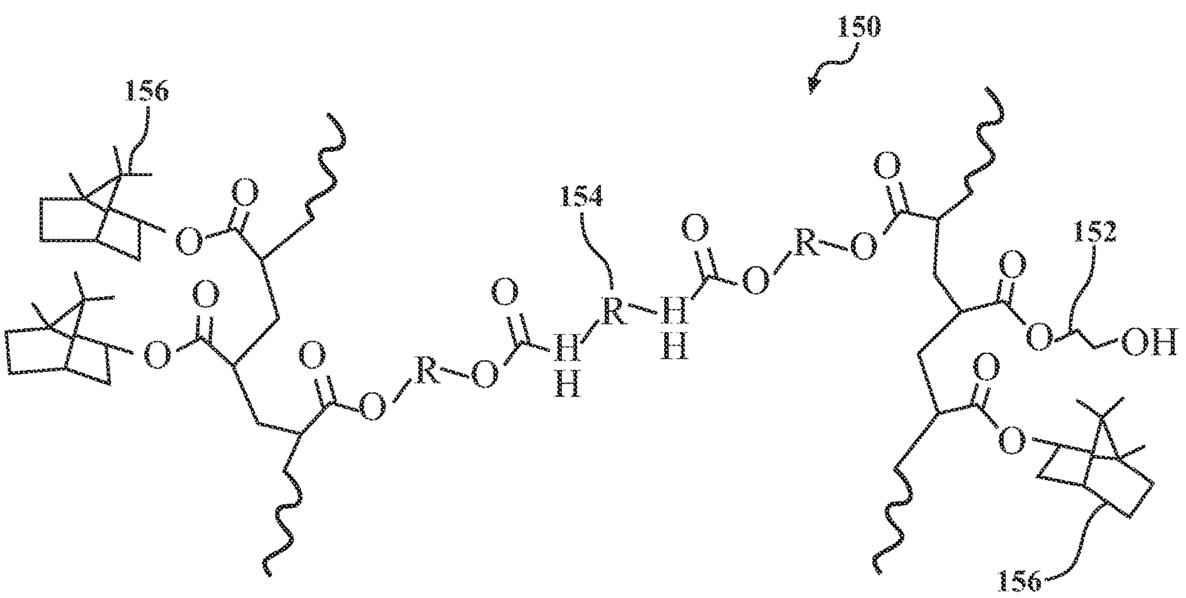
FIG. 2B illustrates the resin in FIG. 2A with cross-linking between the donor moiety, the acceptor moiety, and the rigid moiety.

Referring to FIGS. 2A-2B, one non-limiting example of three monomers included in the resin 150 in the resin are shown. Particularly, the resin 150 includes at least one hydrogen bond donating monomer 152 (2-hydroxyethyl acrylate shown in the figures), at least one hydrogen bond accepting monomer 154 (aliphatic urethane-based diacrylate shown in the figures), and at least one rigid monomer 156 (isobornyl acrylate shown in the figures). In some variations, the at least one hydrogen bond donating monomer 152 can also be a hydrogen bond accepting monomer that is different than the at least one hydrogen bond accepting monomer 154 and/or the least one hydrogen bond accepting monomer 154 can also be a hydrogen bond donating monomer that is different than the at least one hydrogen bond donating monomer 152.

In some variations, the at least one hydrogen bond donating monomer 152 (also referred to herein as "donator moiety 152") is an acrylate monomer with one or more a side groups that include a free carbonyl (—C═O) group or primary, secondary, or tertiary amine side group on an acrylate. And in at least one variation, the at least one hydrogen bond accepting monomer 154 (also referred to herein as "acceptor moiety 154") is an acrylate monomer with one or more side groups that include a free hydroxy (—OH), a primary or secondary amine (—N(H)—, e.g., a urethane (C(O)—N (H)—), or an imine (—N═). And the at least one rigid monomer 156 (also referred to herein as "rigid moiety 156") can be an acrylate monomer with one or more side groups that include one or more of cyclohexyls, substituted cyclohexyls, bicyclic side groups such as isobornyl, norbornyl, and dicylcopentanyl, among others. In addition, the donator moiety 152 and/or the acceptor moiety 154 is an oligomer (e.g., aliphatic urethane-based diacrylate) that functions as crosslinker.

Non limiting examples of the at least one hydrogen bond donating monomer 152 include 2-hydroxyethyl acrylate (2-HEA), caprolactone acrylate, hydroxypropyl acrylate, 2,3-dihydroxypropyl acrylate, 1,3-dihydroxypropyl acrylate, N-hydroxyethyl acrylamide, and aliphatic urethane-based diacrylate. Non-limiting examples of the at least one hydrogen bond acceptor monomer 154 include aliphatic urethane-based diacrylate (AUD) and 2-HEA. And non-limiting examples of the at least one rigid monomer 156 include isobornyl acrylate (IOBA), 4-acryloylmorpholine, methyl methacrylate, 2-hydroxyethyl methacrylate, and isobornyl methacrylate.

In some variations, resins according to the teachings of the present disclosure (also referred to herein simply as "resin 150") include between about 5 weight percent (wt %) and about 35 wt % of the at least one hydrogen bond donator monomer 152, and in at least one variation the resin 150 includes between about 10 wt % and about 30 wt % of the least one hydrogen bond donator monomer 152. And in some variations, the resin 150 includes between about 15 wt % and about 25 wt % of the least one hydrogen bond donator monomer 152. For example, in at least one variation the resin 150 includes about 20 wt % of the least one hydrogen bond donator monomer 152.

In some variations the resin 150 includes between about 5 wt % and about 35 wt % of the at least one hydrogen bond acceptor monomer 154, and in at least one variation the resin 150 includes between about 10 wt % and about 30 wt % of the least one hydrogen bond acceptor monomer 154. And in some variations, the resin 150 includes between about 15 wt % and about 25 wt % of the least one hydrogen bond acceptor monomer 154. For example, in at least one variation the resin 150 includes about 20 wt % of the least one hydrogen bond acceptor monomer 154.

In some variations the resin 150 includes between about 45 wt % and about 75 wt % of the at least one rigid monomer 156, and in at least one variation the resin 150 includes between about 50 wt % and about 70 wt % of the least one rigid monomer 156. And in some variations, the resin 150 includes between about 55 wt % and about 65 wt % of the least one rigid monomer 156. For example, in at least one variation the resin 150 includes about 60 wt % of the least one rigid monomer 156.

In some variations, the resin 150 includes a photoinitiator. For example, in some variations the resin includes between about 0.1 wt % and about 2 wt % of the photoinitiator, for example between about 0.4 wt % and 1.6 wt % of the photoinitiator or between about 0.7 wt % and about 1.3 wt % of the photoinitiator. In at least one variation the resin 150 includes about 1.0 wt % of the photoinitiator. Non-limiting examples of the photoinitiator include photoinitiator 819 (phenylbis(2,4,6-trimethylbenzoyl)phosphine oxide) and camphorquinone.

In some variations, the resin 150 includes a photoabsorber. For example, in some variations the resin includes between about 0.01 wt % and about 1 wt % of the photoabsorber, for example between about 0.025 wt % and 0.5 wt % of the photoabsorber or between about 0.04 wt % and about 0.1 wt % of the photoabsorber. In at least one variation the resin 150 includes about 0.05 wt % of the photoabsorber. Non-limiting examples of the photoabsorber include methylene, coccine, and tartrazine.

In an effort to better describe the resin 150, its properties, and its capabilities for manufacturing monolithic structures with a range of properties, and yet not to limit the scope of the present disclosure in any manner, one example composition of the resin 150 and numerous examples of monolithic structures and corresponding properties are discussed below.

The resin 150 was prepared by mixing monomers of 2-hydroxyethyl acrylate (Sigma-Aldrich, MO, USA), isobornyl acrylate (Sigma-Aldrich), and AUD (Ebecryl 8413, Allnex, GA, USA) with a weight ratio of 20:60:20. Then, 1 wt % photoinitiator (Irgacure 819, Sigma-Aldrich) and 0.05 wt % photo absorber (Sudan I, Sigma Aldrich) were added to the mixture of monomers.

Not being bound by theory, the IBOA and 2-HEA were included as linear chain builders and AUD as a crosslinker. The AUD is a viscous oligomer with high molecular weight aliphatic chains and urethane units, and forms H—N . . . O hydrogen bonds when interacting with 2-HEA and IOBA monomers. Also, the 2-HEA provides abundant —OH groups that form additional O—H . . . O hydrogen bonds.

At a low degree of curing (also known as "degree of cure" and referred to herein as "DoC"), the covalent network with the prevalent hydrogen bonds of the cured resin provides high stretchability in a rubbery state as illustrated in FIG. 2A, while at high DoC, the stiff IBOA exhibits a glass transition temperature ($T_g$) above room temperature as illustrated in FIG. 2B, thereby yielding glassy behaviors with high modulus.

Figure 3A:
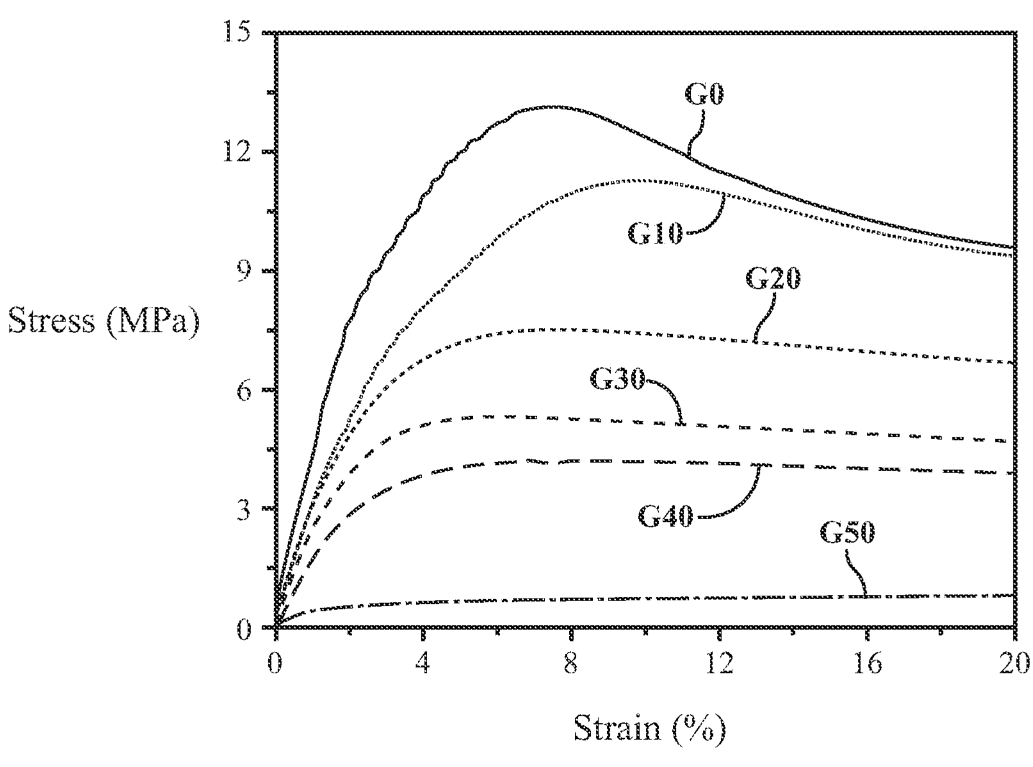
FIG. 3A is a plot of stress versus strain for tensile test samples manufactured with a g-DLP 3D printer using a resin according to the teachings of the present disclosure and printed at a 0% grayscale level (labeled "GO"), a 10% grayscale level (labeled "G10"), a 20% grayscale level (labeled "G20"), a 30% grayscale level (labeled "G30"), a 40% grayscale level (labeled "G40"), and a 50% grayscale level (labeled "G50")
Figure 3B:
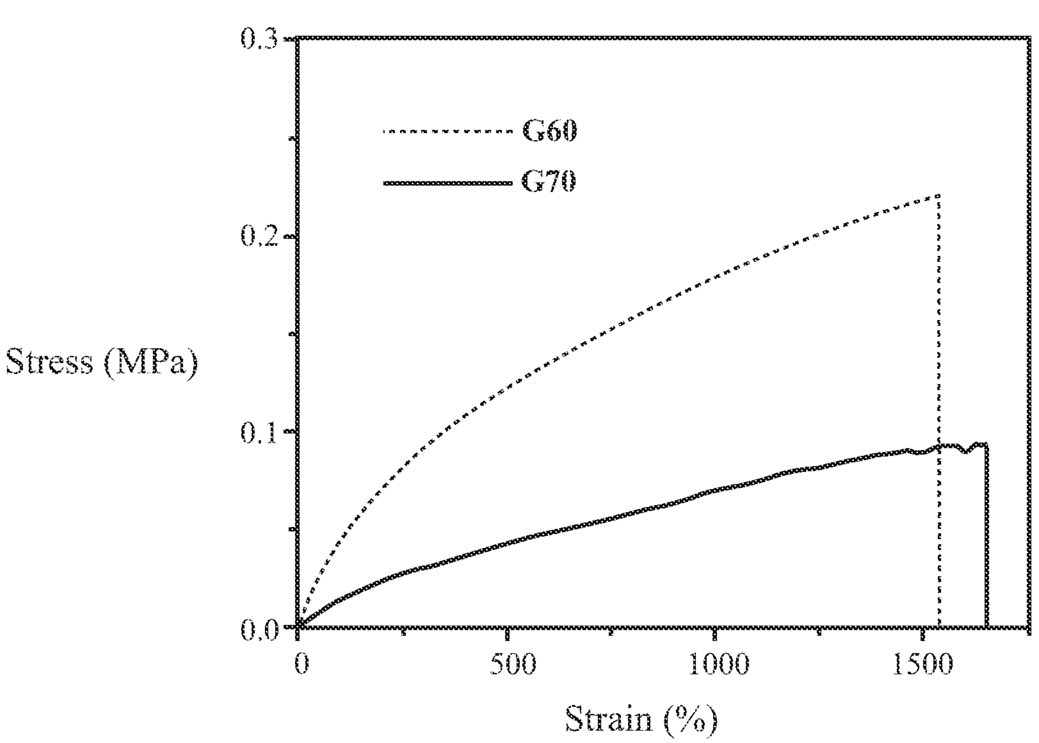
FIG. 3B is a plot of stress versus strain for tensile samples manufactured with a g-DLP 3D printer using a resin according to the teachings of the present disclosure and printed at a 60% grayscale level (labeled "G60") and a 70% grayscale level (labeled "G70")
Figure 3C:
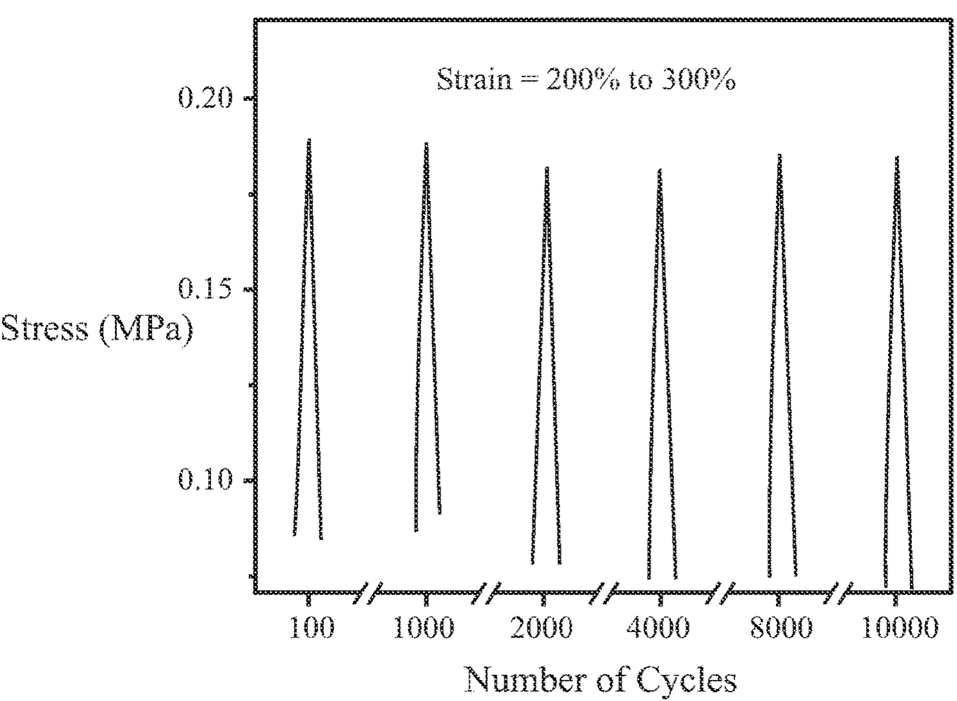
FIG. 3C is a plot of stress versus number of cycles for a "G60" tensile sample manufactured with a g-DLP 3D printing using a resin according to the teachings of the present disclosure and subjected to cycles of strain between 200% and 300%.

The mechanical properties for structures formed from the resin 150 using the g-DLP 3D printer and printed with the different grayscale levels were evaluated with uniaxial tensile tests, and the thermomechanical properties were determined. As shown in FIGS. 3A-3B, the printed polymer gradually became softer from GO down to G50, with a Young's modulus of 487 MPa at GO. This "stiff state" (GO) showed superior toughness also, which was around 109 J/m$^3$. The fracture toughness was also measured with a tearing test and ranged from 650 to 10000 J/m$^2$. The rubbery state G60 and G70 (FIG. 3B) with a conversion around 50-60% possessed a modulus of 0.38 MPa and 0.1 MPa, respectively, and could be stretched up to about 1500%. The extensive presence of hydrogen bonding between the uncured monomers with the crosslinked network made the printed part in a stable organogel state that exhibited excellent elastic properties and resilience even after 10,000 fatigue cycles with high strain between 200% and 300% as shown in FIG. 3C.

Figure 4A:
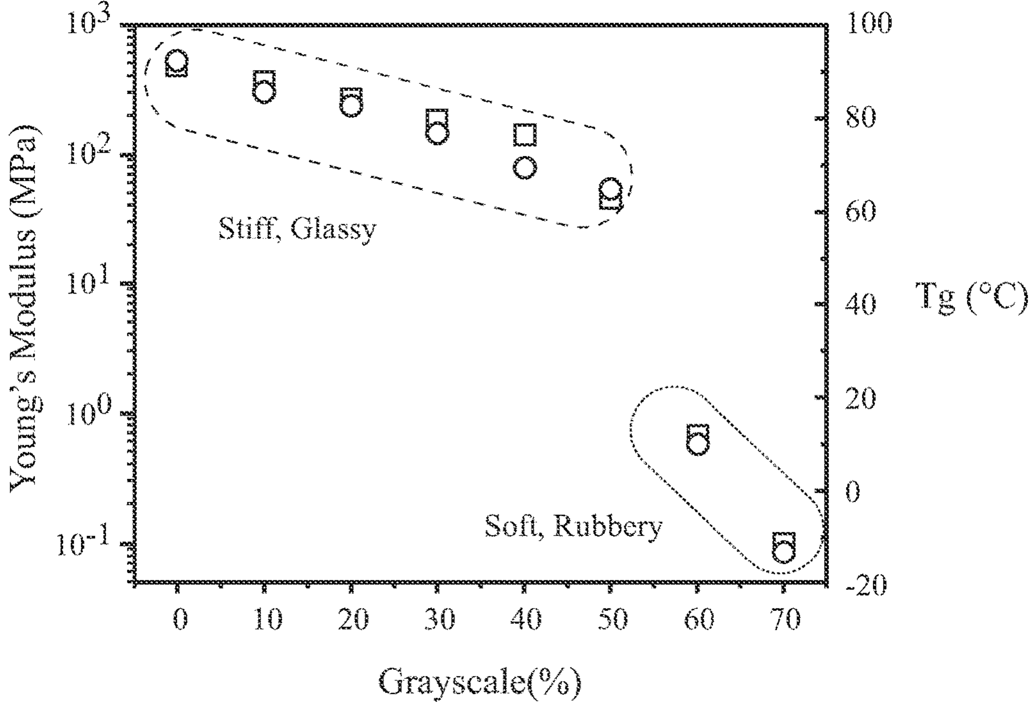
FIG. 4A is a plot of Young's modulus and glass transition temperature versus percent grayscale for tensile samples manufactured with a g-DLP 3D printer using a resin according to the teachings of the present disclosure and printed at GO, G10, G20, G30, G40, G50, G60, G70 grayscale levels.

The stiff monomer IOBA increased the $T_g$ at high DoC and made the network stiff, which ensured the modulus contrast at different DoC. FIG. 4A summarizes the Young's moduli and $T_g$s at different grayscales, showing a Young's modulus contrast between stiff GO and soft G70 more than 4800 times. Also, FIG. 4B shows a comparison of the Young's modulus versus elongation for monolithic structures formed from the resin 150 and DLP materials reported in the literature. As shown in FIG. 4B, the resin 150 provides a range of Young's modulus and elastic elongation greater than any known material reported in the literature. Accordingly, the experimental results illustrate that using monomers that form a cured network chain through hydrogen bonding provide high stretchability at low DoC.

Figure 5C:
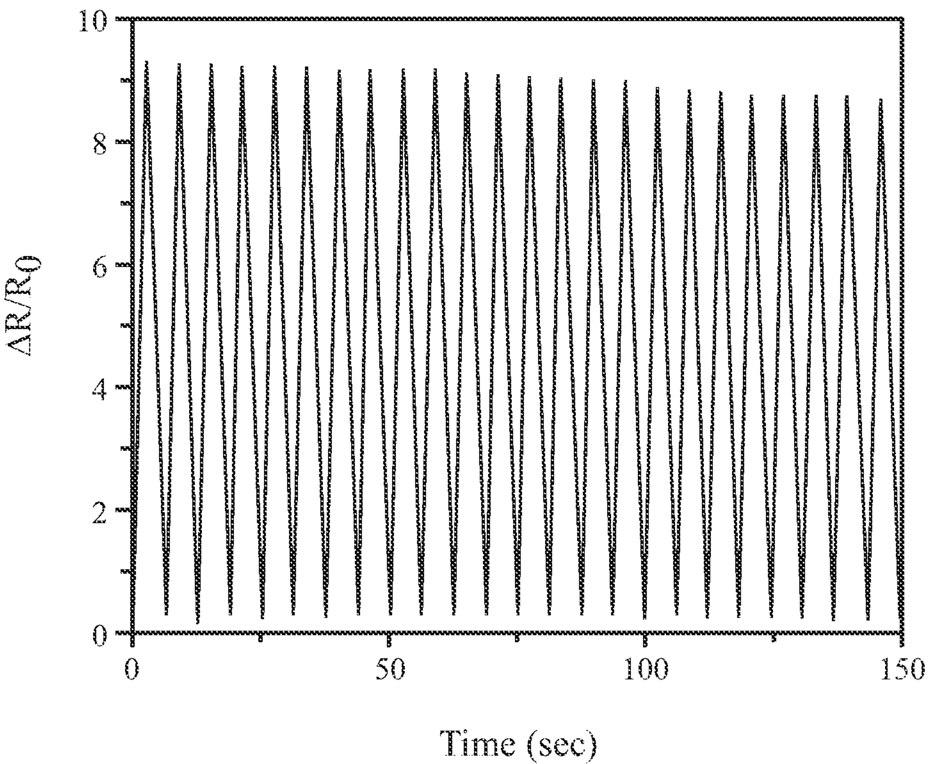
FIG. 5C is a plot of change in resistance versus time for the extension strain gauge in FIGS. 5A-5B during cyclic straining or stretching to 200% strain.

Referring to FIG. 5A, the sensor 20 formed from the resin 150 (FIG. 1) is shown. The sensor 20 is in the form of a simple monolithic extension strain gauge and includes a pair of spaced apart stiff ends 200 and the soft membrane 210 extending between the pair of spaced apart stiff ends 200. Also, the wave-shaped microfluidic channel 212 (illustrated with a solid line for clarity) extends within the soft membrane 210 and was printed, i.e., left void, within and during printing of the soft membrane 210. The wave-shaped microfluidic channel 212 was filled with a eutectic gallium-indium alloy (EgaIn, Sigma-Aldrich) that was liquid at room temperature and conductive leads (not shown) were glued into the ends of the wave-shaped microfluidic channel 212 for resistance measurement of the eutectic gallium-indium alloy during testing. Particularly, the sensor 20 was stretched such that the wave-shaped microfluidic channel 212 increased in length (and decreased in average diameter) as illustrated in FIG. 5B. In addition, increasing the length and reducing the diameter of the wave-shaped microfluidic channel 212 dramatically increased the resistance of the eutectic gallium-indium alloy therewithin. For example, and with reference to FIG. 5C, the change in resistance as a function of time of the eutectic gallium-indium alloy within the wave-shaped microfluidic channel 212 was measured with a multimeter as the sensor 20 was cyclically subjected to large deformation (200% strain) for a total of 24 cycles. Accordingly, g-DLP 3D printing the sensor 20 from the resin 150 provides a simple but versatile strain gauge.

Figures 6A, 6B:
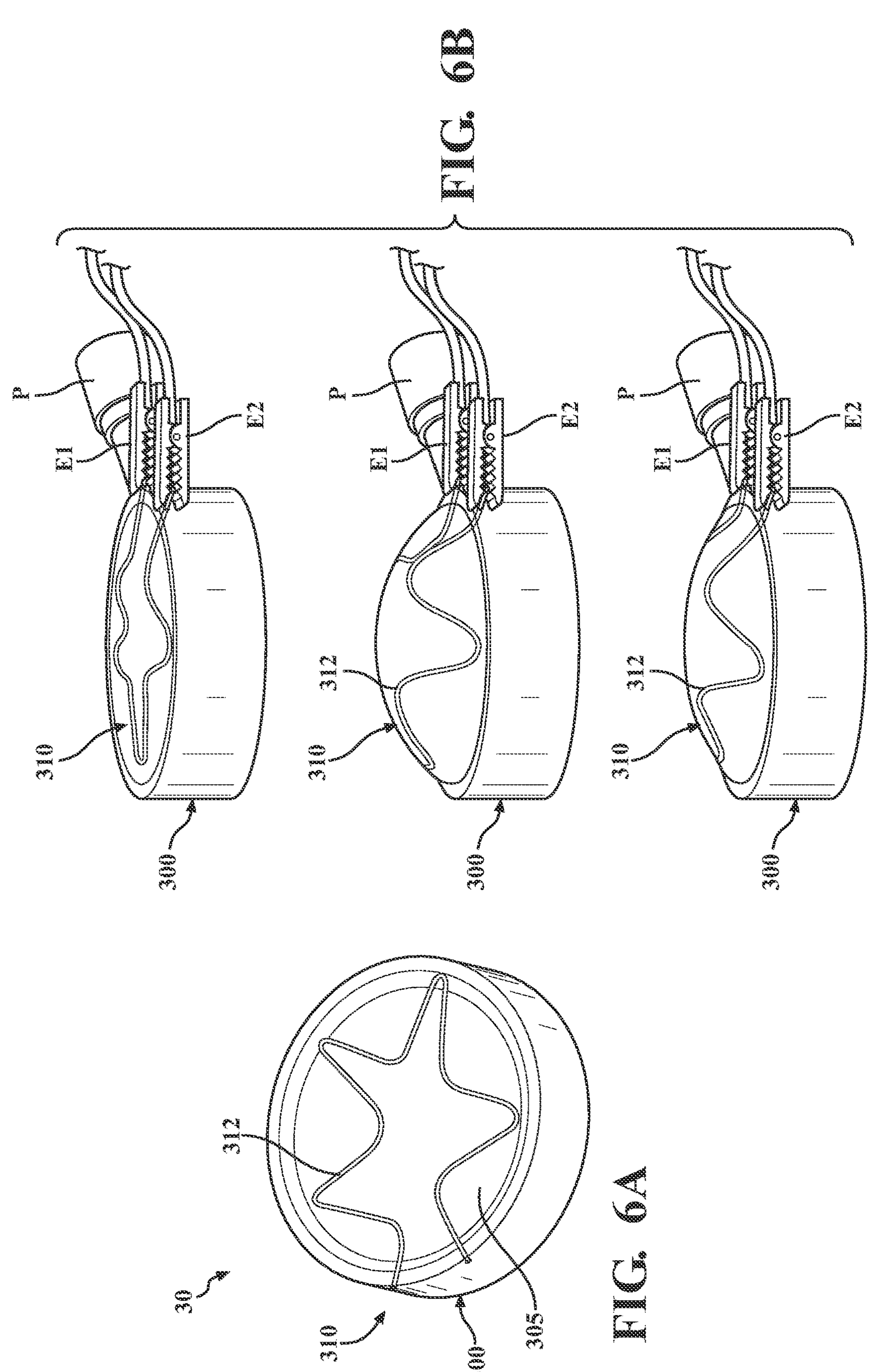
FIG. 6A shows a pressure sensor with a microfluidic channel in a soft membrane according to the teachings of the present disclosure.
FIG. 6B shows the pressure sensor in FIG. 6A with different amounts of pressure within the pressure sensor.

Referring to FIG. 6A, a sensor 30 formed from the resin 150 (FIG. 1) is shown. The sensor 30 is in the form of an expandable pressure gauge and includes a monolithic body with a stiff base 300, a soft membrane 310 with a wave-shaped microfluidic channel 312 (illustrated with a solid line for clarity) extending therewithin, and a hollow or vacant interior 305 defined by the stiff base 300 and soft membrane 310. The wave-shaped microfluidic channel 312 was printed, i.e., left void, within and during printing of the soft membrane 310. The wave-shaped microfluidic channel 312 was filled with the eutectic gallium-indium alloy discussed above and conductive leads E1, E2 were glued into the ends of the wave-shaped microfluidic channel 212 for resistance measurement during testing. Particularly, the sensor 30 was stretched with the application of pressure in the interior 305 via a pump line P such that the soft membrane 310 stretched and the wave-shaped microfluidic channel 212 increased in length (and decreased in average diameter) as illustrated in FIG. 6B. In addition, the base 300 was printed at a higher grayscale (GO) such that deformation was confined to the soft membrane 310 alone.

Figure 6C:
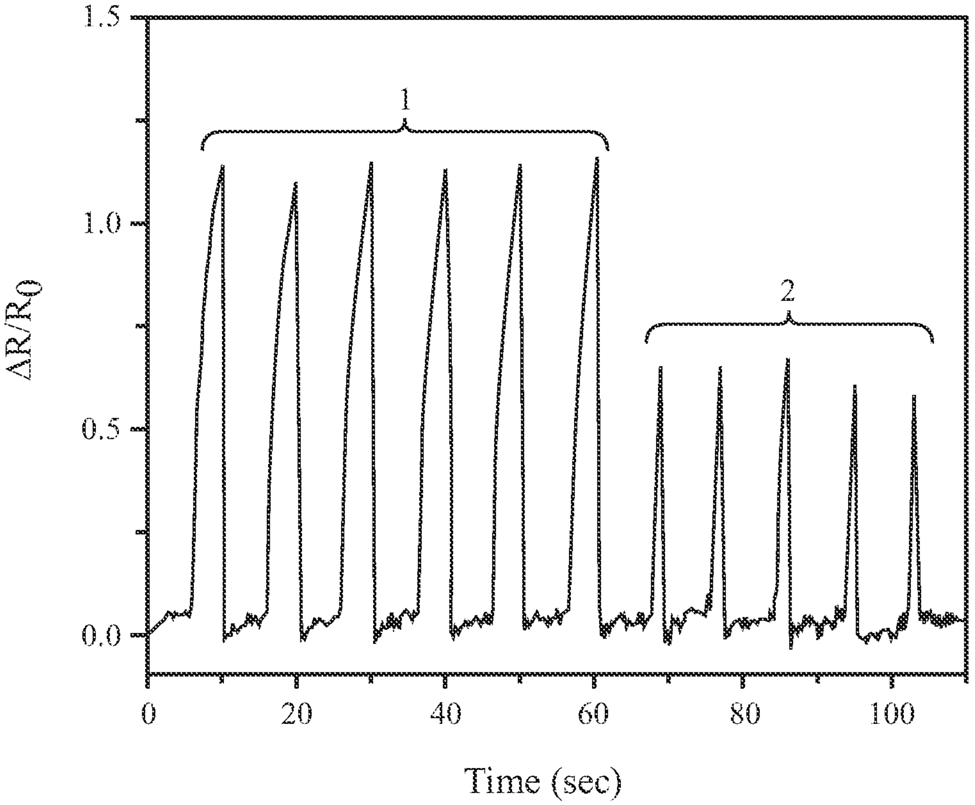
FIG. 6C is a plot of change in resistance versus time for the pressure sensor in FIGS. 6A-6B during cyclic applications of pressure within the pressure sensor.

Similar to stretching sensor 20 described above, increasing the length, and decreasing the average diameter of the wave-shaped microfluidic channel 312 dramatically increased the resistance of the eutectic gallium-indium alloy therewithin. That is, when internal pressure was applied to the sensor 30, the soft membrane 310 deformed upwards and increased, the wave-shaped microfluidic channel 312 increased in length and decreased in average diameter. And this change in length and average diameter provided for the sensor 30 to accurately capture different pressure levels with relatively small deformation, as shown in the plot in FIG. 6C. Also, a unique feature of the resin 150 is that a membrane's stiffness can be adjusted to alter the sensitivity of the sensor without the need to change the thickness of the membrane. Accordingly, g-DLP 3D printing the sensor 30 from the resin 150 provides a simple but versatile pressure gauge.

The g-DLP 3D printing with the resin 150 also has unique advantages for fabricating customized human wearable electronic devices and sensors. The rubbery state covers the mechanical pliability range of human skin (Young's modulus ranging between about 130 kPa to about 657 kPa) and the stiff state enables intimate conformability to mount the body without extra fixtures. For example, and with reference to FIG. 7A, a sensor 40 formed from the resin 150 (FIG. 1) is shown. The sensor 40 is in the form of a finger-mounted sensor with a pair of spaced apart stiff ends 400 and a soft membrane 410 extending between the pair of spaced apart stiff ends 400. The pair of spaced-apart stiff ends were manufactured and dimensioned to fit over and on a finger 'F' as shown in FIG. 6B.

Figure 7B:
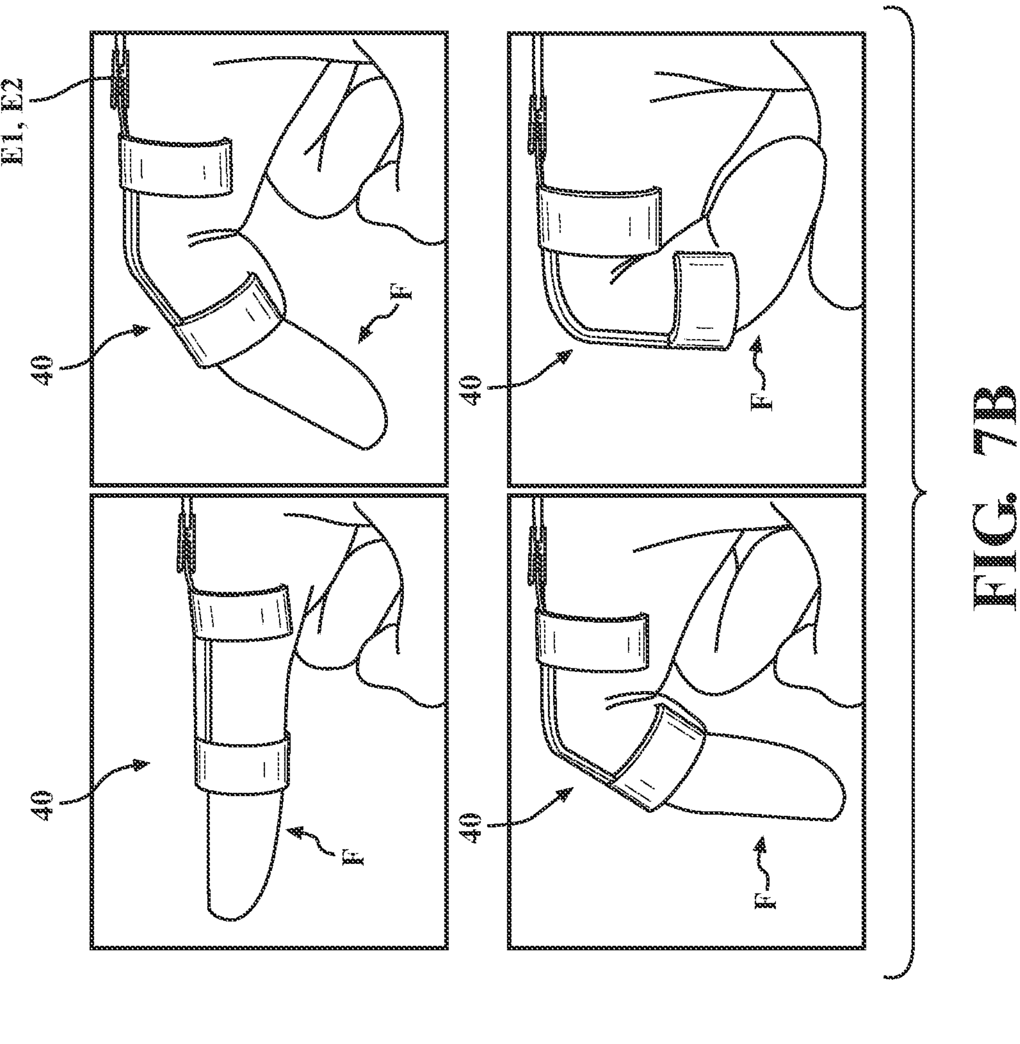
FIG. 7B shows the finger mounted sensor in FIG. 7A on a finger and being subjected to different amounts of bending.
Figure 7A:
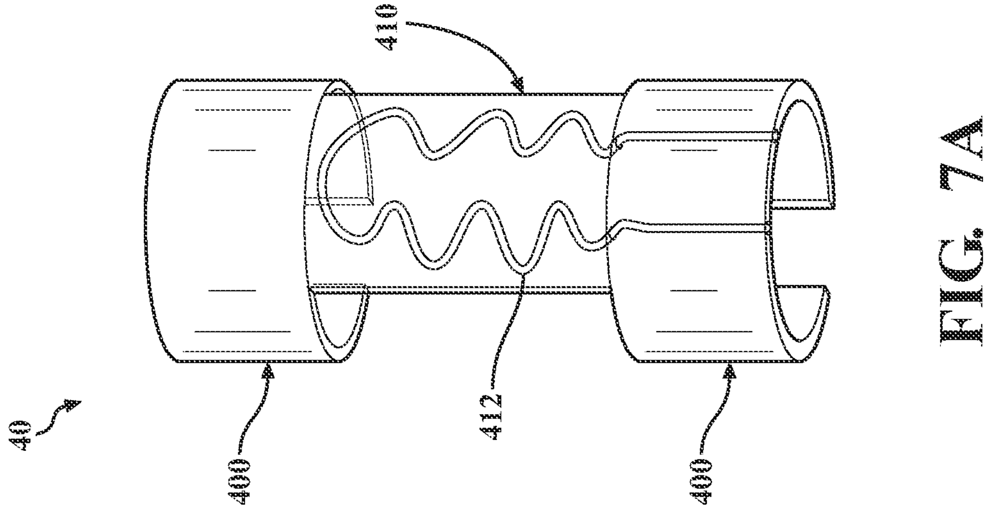
FIG. 7A shows a finger mounted sensor with a wave-shaped microfluidic channel in a soft membrane positioned between a pair of stiff ends according to the teachings of the present disclosure.
Figure 7C:
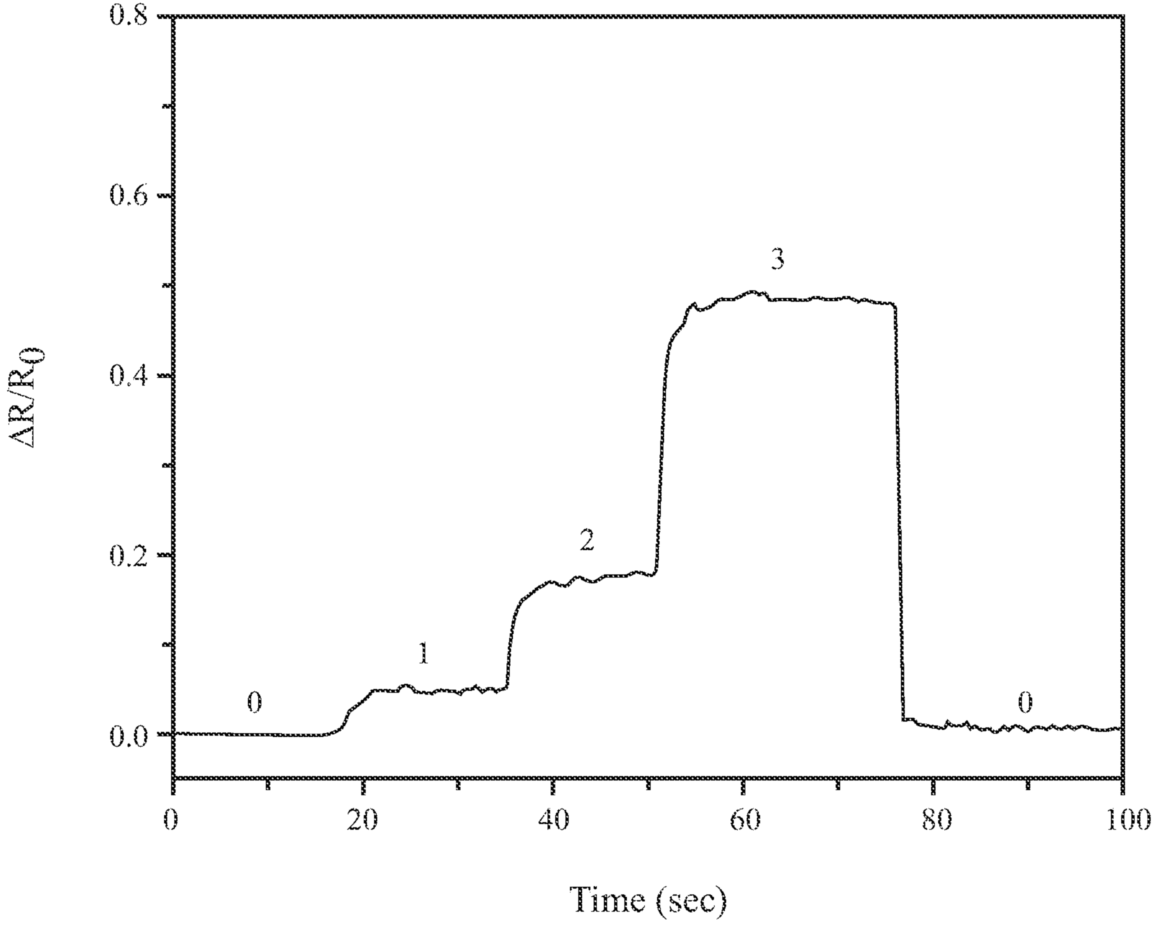
FIG. 7C is a plot of change in resistance versus time for the finger mounted sensor during bending of the finger shown in FIG. 7B.

A wave-shaped microfluidic channel 412 (illustrated with a solid line for clarity) was printed, i.e., left void, within and during printing of the soft membrane 410 and was filled with the eutectic gallium-indium alloy discussed above. Conductive leads (not labeled) were glued into the ends of the wave-shaped microfluidic channel 412 for resistance measurement during testing and soft membrane 410 was stretched with bending of the finger F as shown in FIG. 7B. Also, bending of the finger F and stretching of the soft membrane 410 increased the length and decreased the average diameter of the wave-shaped microfluidic channel 412. The wave-shaped microfluidic channel 412 was smaller (0.4 mm) that the wave-shaped microfluidic channels 212 and 312 discussed above which provided higher sensitivity and detection of bending of the finger F as shown in the plot in FIG. 7C. Similar sensors can easily be designed to fit different users or joints for both humans and robots. Overall, it demonstrates the capability for various challenging applications.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure and are not intended to limit the disclosure of the technology or any aspect thereof. The recitation of multiple forms or variations having stated features is not intended to exclude other forms or variations having additional features, or other forms or variations incorporating different combinations of the stated features.

As used herein the terms "about" and "generally" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with a form or variation is included in at least one form or variation. The appearances of the phrase "in one variation" or "in one form" (or variations thereof) are not necessarily referring to the same form or variation. It should be also understood that the various method steps discussed herein do not have to be carried out in the same order as depicted, and not each method step is required in each form or variation.

The foregoing description of the forms or variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

While particular forms or variations have been described, alternatives, modifications, variations, improvements, and substantial equivalents that are or may be presently unforeseen may arise to applicants or others skilled in the art. Accordingly, the appended claims as filed and as they may be amended, are intended to embrace all such alternatives, modifications variations, improvements, and substantial equivalents.

What is claimed is:

1. A substrate for a sensor, the substrate comprising:

a grayscale digital light processing (g-DLP) 3D printed monolithic substrate with at least one microfluid channel containing an electrically resistive fluid therein, the monolithic substrate formed from a resin configured to form a solid polymer using single-vat single cure g-DLP 3D printing with a Young's modulus ranging from 0.1 MPa to 100 MPa, the monolithic substrate having a first portion with a Young's modulus less than 1 MPa and a second portion with a Young's modulus greater than 10 MPa.

2. The substrate according to claim 1, wherein the resin comprises:

a donor moiety in the form of an acrylate monomer with a side group comprising at least one of a free carbonyl, a primary amine on an acrylate, a secondary amine on an acrylate, and a tertiary amine on an acrylate;

an acceptor moiety different than the donor moiety, the acceptor moiety in the form of an acrylate monomer with a side group comprising at least one of a free hydroxy, a primary amine, secondary amine, and an imine;

a rigid moiety in the form of an acrylate monomer with a side group comprising of one or more of a cyclohexyl, a substituted cyclohexyl, and a bicyclic structure;

a photoinitiator; and a photoabsorber.

3. The substrate according to claim 2, wherein one of the donor moiety and the acceptor moiety is an oligomer crosslinker.

4. The substrate according to claim 2, wherein the donor moiety is selected from at least one of 2-hydroxyethyl acrylate, caprolactone acrylate, hydroxypropyl acrylate, 2,3-dihydroxypropyl acrylate, 1,3-dihydroxypropyl acrylate, N-hydroxyethyl acrylamide, and aliphatic urethane-based diacrylate.

5. The substrate according to claim 4, wherein the donor moiety is between about 10 wt. % to about 30 wt. % of an overall composition of the resin.

6. The substrate according to claim 5, wherein the donor moiety is the 2-hydroxyethyl acrylate.

7. The substrate according to claim 2, wherein the acceptor moiety is selected from at least one of aliphatic urethane-based diacrylate and 2-hydroxyethyl acrylate.

8. The substrate according to claim 7, wherein the acceptor moiety is between about 10 wt. % to about 30 wt. % of an overall composition of the resin.

9. The substrate according to claim 8, wherein the acceptor moiety is the aliphatic urethane-based diacrylate.

10. The substrate according to claim 2, wherein the rigid moiety is selected from at least one of isobornyl acrylate, 4-acryloylmorpholine, methyl methacrylate, 2-hydroxyethyl methacrylate, and isobornyl methacrylate.

11. The substrate according to claim 10, wherein the rigid moiety is between about 50 wt. % to about 70 wt. % of an overall composition of the resin.

12. The substrate according to claim 11, wherein the rigid moiety is isobornyl acrylate.

* * * * *